United States Patent
Geen et al.

(10) Patent No.: US 12,518,962 B2
(45) Date of Patent: Jan. 6, 2026

(54) METHOD AND SYSTEM FOR MIXED GROUP V PRECURSOR PROCESS

(71) Applicant: IQE plc, Cardiff (GB)

(72) Inventors: Matthew Geen, Cardiff (GB); Rodney Pelzel, Cardiff (GB)

(73) Assignee: IQE plc, Cardiff (GB)

( * ) Notice: Subject to any disclaimer, the term of this patent is extended or adjusted under 35 U.S.C. 154(b) by 470 days.

(21) Appl. No.: 18/128,433

(22) Filed: Mar. 30, 2023

(65) Prior Publication Data

US 2023/0326743 A1     Oct. 12, 2023

(30) Foreign Application Priority Data

Apr. 11, 2022    (GB) ...................................... 2205301

(51) Int. Cl.
| | | |
|---|---|---|
| H01L 21/02 | (2006.01) | |
| H01L 29/66 | (2006.01) | |
| H10D 10/01 | (2025.01) | |

(52) U.S. Cl.
CPC .. *H01L 21/02205* (2013.01); *H01L 21/02175* (2013.01); *H01L 21/022* (2013.01); *H10D 10/021* (2025.01)

(58) Field of Classification Search
CPC .................... H01L 21/02205; H01L 21/02175
See application file for complete search history.

(56) References Cited

U.S. PATENT DOCUMENTS

| | | |
|---|---|---|
| 2002/0000546 A1 | 1/2002 | Sato |
| 2004/0219703 A1 | 11/2004 | Bour et al. |
| 2013/0112275 A1 | 5/2013 | Hekmatshoar-Tabari et al. |
| 2018/0019117 A1* | 1/2018 | Washington ...... H01L 21/02546 |
| 2019/0305039 A1 | 10/2019 | Wang et al. |
| 2021/0062360 A1 | 3/2021 | Kunert et al. |

FOREIGN PATENT DOCUMENTS

EP     1361601 A2    11/2003

OTHER PUBLICATIONS

Combined Search and Examination Report in Great Britain Application No. 2205301.1, mailed Sep. 20, 2022, 6 pages.
(Continued)

*Primary Examiner* — John A Bodnar
(74) *Attorney, Agent, or Firm* — Sterne, Kessler, Goldstein & Fox P.L.L.C.

(57) ABSTRACT

A method of forming a layer includes introducing a Group III precursor in a reactor, introducing a hydride Group V precursor in the reactor, and introducing a metal-organic Group V precursor in the reactor to form the layer. The method can further include mixing the hydride Group V precursor and the metal-organic Group V precursor. Advantageously, the layer and method of forming the layer utilize mixed Group V precursors, improve uniformity, decrease thermal sensitivity of the end material, normalize concentration profiles of precursors, improve yield, increase manufacturing efficiency, improve control of III-V ratios (e.g., pressure, growth rate, flux), and reduce manufacturing costs.

21 Claims, 8 Drawing Sheets

(56) References Cited

OTHER PUBLICATIONS

Nakamura et al., "Thickness monitoring of GaAs growth by surface photoabsorption in metalorganic chemical vapor deposition," Journal of Applied Physics, vol. 83, No. 2, pp. 775-778, Jan. 15, 1998.
Jordan et al., "Thermodynamic interpretation of quaternary (InGaAsP) layer uniformity grown by low-pressure metalorganic vapor phase epitaxy," Applied Physics Letters, vol. 62, No. 4, pp. 360-362, Jan. 25, 1993.
Vodjdani et al., "Parametric studies of GaAs growth by metalorganic molecular beam epitaxy," Journal de Physique, Colloquium C5, Supplement to No. 12, vol. 43, pp. 339-349, Dec. 1982.
H. Saito et al., "MOVPE growth of strained InGaAsN/GaAs quantum wells", Journal of Crystal Growth, vol. 195, No. 1-4, pp. 416-420, Dec. 15, 1998, 5 pages.
A. Ougazzaden et al., "High-Quality Growth by Metalorganic Vapor-Phase Epitaxy Using Nitrogen Carrier Gas and Dimenthylhydrazine, Tertiarbutylarsine as Group V Precursors," Japanese Journal of Applied Physics, vol. 38, No. 2B, Part 1, pp. 1019-1021, Feb. 1, 1999, 3 pages.
Extended European Search Report in European Application No. 23161789.5, mailed Sep. 6, 2023, 6 pages.

\* cited by examiner

METHOD AND SYSTEM FOR MIXED GROUP V PRECURSOR PROCESS

CROSS REFERENCE TO RELATED APPLICATION

This application claims priority to GB Application No. 2205301.1, filed Apr. 11, 2022, which is hereby incorporated herein in its entirety by reference.

BACKGROUND

Field

The present disclosure relates to epitaxy apparatuses, systems, and methods, for example, epitaxy apparatuses, systems, and methods for forming a III-V semiconductor layer from mixed Group V precursors to improve uniformity and reduce cost.

Background

Epitaxy refers to crystal growth or material deposition in which new crystalline layers are formed with one or more well-defined orientations. Epitaxy can be used to grow high quality, single crystal III-V semiconductors. III-V semiconductors can be used for optoelectronic devices as well as high frequency and high power devices. A III-V semiconductor includes one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P), arsenic (As), antimony (Sb), bismuth (Bi)). In principle, any combination of Group III and Group V elements can be used, but the ratio of the total Group III elements in the final compound and total Group V elements maintains a 1:1 relationship.

Epitaxy can include molecular beam epitaxy (MBE) or metal-organic vapor phase epitaxy (MOVPE), also known as metal-organic chemical vapor deposition (MOCVD). In MBE, source materials are heated to produce evaporated beams of reagent in an ultra-high vacuum (e.g., about $10^{-9}$ torr) that impinge onto a heated substrate. Elemental sources can be heated in dedicated furnaces and the associated evaporated beams are controlled, through the use of shutters, directed towards the substrate without carrier gases (e.g., $H_2$), and the elemental constituents can react at the substrate surface to form an epitaxial layer. In MOCVD, hydride and/or metal-organic sources (e.g., precursors) can be flowed over a heated substrate in a reaction chamber using a carrier gas (e.g., $H_2$) to decompose the compound precursors. The compound precursors are decomposed (e.g., cracked, pyrolised) in the gas phase into their constituent elements and then reacted at the substrate surface to form an epitaxial layer.

For MOCVD, the choice and management of Group V precursors is complex. There are two types of Group V precursors, metal-organic Group V precursors and hydride Group V precursors. The cracking temperatures and incorporation efficiencies varies considerably for different Group V precursors, resulting in a complexity that must be managed as part of the growth process. This situation is particularly challenging for mixed Group V materials, where the Group V sublattice includes at least two Group V elements. In some instances, the thermal characteristics of metal-organic Group V precursors give them an advantage for uniformity. However, this benefit is offset by the fact that metal-organic Group V materials are more costly and contain more impurities (e.g., oxygen that can result in compromising the optical properties of the semiconductor) as compared to Group V hydride sources, and this must be considered in order to define the optimal process.

SUMMARY

Accordingly, there is a need to utilize mixed precursors (e.g., mixed Group V precursors) in order to simultaneously optimize the process to decrease thermal sensitivity, improve control of III-V ratios, improve on-wafer yield (e.g., via improved on-wafer uniformity), improve in-run yield (e.g., better wafer-to-wafer mean wavelength matching), increase manufacturing efficiency, and reduce manufacturing costs (e.g., reduce amount of metal-organic precursors needed). Further, there is a need to utilize a MOCVD reactor with a multiple-zone nozzle where different Group V precursors can be flexibly introduced to the different zones in order to enable control of the Group V profile/concentration in the boundary layer and/or reaction zone at the surface. This allows fine control of the reaction kinetics at the surface in order to control layer composition and uniformity.

Forming a layer is achieved by introducing controlled amounts of Group III and Group V precursors into a reaction chamber. Advantageously, the method utilizes mixed Group V precursors which results in a simultaneous achievement of a highly uniform wafer that can be manufactured cost effectively. In some aspects, a method of forming a layer can include introducing a Group III precursor in a reactor. In some aspects, the method can further include introducing a hydride Group V precursor in the reactor. In some aspects, the method can further include introducing a metal-organic Group V precursor in the reactor to form the layer.

In some aspects, the method can further include mixing the hydride Group V precursor and the metal-organic Group V precursor. In some aspects, the mixing can occur in a precursor manifold of the reactor. In some aspects, the mixing can occur in a nozzle of the reactor. In some aspects, the mixing can occur in a showerhead of the reactor. In some aspects, the mixing can occur in a reaction chamber of the reactor.

In some aspects, the mixing of the hydride Group V precursor (e.g., phosphine ($PH_3$)) and the metal-organic precursor (e.g., tertiary-butyl phosphine (TBP) ($C_{12}H_{27}P$)) can normalize the Group V concentration profile (e.g., constant across the layer and wafer) which improves uniformity and yield.

In some aspects, the mixing can include controlling a mass concentration ratio between the hydride Group V precursor and the metal-organic Group V precursor. Advantageously, the mass concentration ratio (e.g., metal-organic Group V precursor:hydride Group V precursor) can be controlled (e.g., 50:50, 40:60, 30:70, 20:80, etc.) in order to optimize (minimize) the manufacturing cost and improve safety (through the reduction of the hydride Group V precursor).

In some aspects, the mixing can include controlling reaction kinetics of the hydride Group V precursor and the metal-organic Group V precursor in the reaction chamber to control uniformity of the layer. Advantageously, reaction kinetics of the mixed Group V precursors can be controlled (e.g., with a multi-zone nozzle or showerhead) which improves uniformity of the layer and improves yield.

In some aspects, the introduction of the hydride Group V precursor can include flowing, into the reaction chamber, phosphine ($PH_3$), arsine ($AsH_3$), ammonia ($NH_3$), stibine ($SbH_3$), or bismuthine ($BiH_3$). Advantageously, the mixed Group V precursors can include some concentration (e.g., metal-organic Group V precursor: hydride Group V precursor) of the hydride Group V precursor (e.g., 50:50, 40:60, 30:70, 20:80, etc.) which reduces manufacturing costs and improves safety.

In some aspects, the introducing the metal-organic Group V precursor can include flowing, into the reaction chamber, tertiary-butyl phosphine (TBP) ($C_{12}H_{27}P$), bisphosphinoethane (BPE) ($C_2H_8P_2$), trimethyl arsine (TMA) ($C_3H_9As$), tertiary-butyl arsine (TBA) ($C_4H_{11}As$), monoethyl arsine (MEA) ($C_2H_8As$), tertiary-butyl amine (TBAm) ($C_4H_{11}N$), dimethylhydrazine (DMHy) ($C_2H_8N_2$), phenylhydrazine ($C_6H_8N_2$), trimethyl antimony (TMSb) ($C_3H_9Sb$), triethyl antimony (TESb) ($C_6H_{15}Sb$), tri-isopropyl antimony (TIPSb) ($C_9H_{21}Sb$), or a bismuth metal-organic framework (Bi-MOF). Advantageously, the mixed Group V precursors can include some concentration (e.g., metal-organic Group V precursor: hydride Group V precursor) of the metal-organic Group V precursor (e.g., 50:50, 40:60, 30:70, 20:80, etc.) which improves uniformity, normalizes concentration profiles of the precursors, improves yield, and improves safety.

In some aspects, the hydride Group V precursor can include phosphine ($PH_3$), and the metal-organic Group V precursor can include tertiary-butyl phosphine (TBP) ($C_{12}H_{27}P$). Advantageously, a mixed $PH_3$ and TBP process can be used to improve cross-wafer compositional uniformity at the minimum cost possible.

In some aspects, the hydride Group V precursor can include arsine ($AsH_3$), and the metal-organic Group V precursor can include trimethyl arsine (TMA) ($C_3H_9As$). Advantageously, a mixed $AsH_3$ and TMA process can be used to improve cross-wafer compositional uniformity at the minimum cost possible.

In some aspects, the hydride Group V precursor can include ammonia ($NH_3$), and the metal-organic Group V precursor can include dimethylhydrazine (DMHy) ($C_2H_8N_2$). Advantageously, a mixed $NH_3$ and DMHy process can be used to improve cross-wafer compositional uniformity at the minimum cost possible.

In some aspects, the hydride Group V precursor can include stibine ($SbH_3$), and the metal-organic Group V precursor can include trimethyl antimony (TMSb) ($C_3H_9Sb$). Advantageously, a mixed $SbH_3$ and TMSb process can be used to improve cross-wafer compositional uniformity at the minimum cost possible.

In some aspects, the method can further include forming a second layer on the layer. In some aspects, the second layer can be a III-V semiconductor. Advantageously, the second layer and the layer can form a III-V semiconductor layered structure for high quality and high yield devices (e.g., heterojunction bipolar transistors (HBTs), field effect transistors (FETs), heterostructure FETs (HFETs), high-electron-mobility transistors (HEMTs), pseudomorphic HEMTs (PHEMTs), PIN diodes, avalanche photodiodes (APDs), edge emitting lasers (EELs), distributed feedback lasers (DFBs), vertical cavity surface emitting lasers (VCSELs), light emitting diodes (LEDs), and other electronic or photonic/optoelectronic devices).

In some aspects, a method of forming a layered structure can include combining a hydride Group V precursor and a metal-organic Group V precursor with a Group III precursor in a reaction chamber to form a III-V semiconductor layer on a substrate. In some aspects, the method can include combining a hydride Group V precursor and a metal-organic Group V precursor. In some aspects, the method can further include combining a Group III precursor and the hydride and metal-organic Group V precursors in a reaction chamber to form a III-V semiconductor layer on a substrate. Advantageously, the method utilizes mixed Group V precursors which improves uniformity of the III-V semiconductor layer and reduces manufacturing costs.

In some aspects, the hydride Group V precursor and the metal-organic Group V precursor can include the same Group V element. Advantageously, mixed hydride and metal-organic Group V precursors can improve uniformity of the layer, reduce manufacturing costs, and improve safety.

In some aspects, the Group V element can include phosphorus (P), arsenic (As), nitrogen (N), antimony (Sb), or bismuth (Bi). Advantageously P, As, N, Sb, or Bi elements can be reacted with the Group III precursors to produce high quality and high yield devices (e.g., HBTs, FETs, HFETs, HEMTs, PHEMTs, PIN diodes, APDs, EELs, DFBs, VCSELs, LEDs, or other electronic or photonic/optoelectronic devices).

In some aspects, the combining can include reacting the Group III precursor and the hydride and metal-organic Group V precursors in a metal-organic chemical vapor deposition (MOCVD) reaction chamber. Advantageously, the MOCVD reaction chamber can grow high quality and thick (e.g., greater than 3 μm) III-V semiconductor layers for various devices (e.g., HBTs, FETs, HFETs, HEMTs, PHEMTs, PIN diodes, APDs, EELs, DFBs, VCSELs, LEDs, or other electronic or photonic/optoelectronic devices). Further advantageously, the MOCVD reaction chamber can include a multi-zone nozzle which provides multiple-zones for different Group V precursors, enables control of when a specific Group V precursor (e.g., phosphine) enters a boundary layer and/or a reaction zone at the III-V semiconductor layer, and finely tunes reaction kinetics at the III-V semiconductor layer surface.

In some aspects, the combining can include reacting the Group III precursor and the hydride and metal-organic Group V precursors in a molecular beam epitaxy (MBE) reaction chamber. Advantageously, the MBE reaction chamber can grow high quality and thin-film single crystal III-V semiconductor layers for various devices (e.g., HBTs, FETs, HFETs, HEMTs, PHEMTs, PIN diodes, APDs, EELs, DFBs, VCSELs, LEDs, or other electronic or photonic/optoelectronic devices). Advantageously, combining the hydride and metal-organic Group V precursors prior to combining with the Group III precursor can improve inlet control of concentration ratios of the hydride and metal-organic Group V precursors (e.g., metal-organic Group V precursor: hydride Group V precursor) to normalize concentration profiles of the individual precursors, improve uniformity of the layer, reduce manufacturing costs, and improve safety.

In some aspects, the combining the hydride and metal-organic Group V precursors can include separately introducing the hydride and metal-organic Group V precursors into the reaction chamber. Advantageously, separately introducing the hydride and metal-organic Group V precursors can improve inlet control, concentration ratios of the hydride and metal-organic Group V precursors (e.g., metal-organic Group V precursor: hydride Group V precursor) to normalize concentration profiles of the individual precursors, improve uniformity of the layer, reduce manufacturing costs, and improve safety.

In some aspects, the combining can include sequentially introducing the hydride Group V precursor, the metalorganic Group V precursor, and the Group III precursor into the reaction chamber. In some aspects, the sequentially introducing can include introducing the Group III precursor with one of the Group V precursors (e.g., hydride Group V precursor) separate from the other Group V precursor (e.g., metal-organic Group V precursor). In some aspects, the sequentially introducing can include introducing the hydride and metal-organic Group V precursors separate from the Group III precursor. Advantageously, sequentially introducing the hydride Group V precursor, the metal-organic Group V precursor, and the Group III precursor can provide different reaction recipes (e.g., precursor combinations), improve inlet control, improve concentration ratio control (e.g., metal-organic Group V precursor:hydride Group V precursor), to normalize concentration profiles of the individual precursors, improve uniformity of the layer, reduce manufacturing costs, and improve safety.

In some aspects, a layered structure can include a layer having a III-V material grown with a hydride Group V precursor and a metal-organic Group V precursor. Advantageously, the layer has the III-V material grown from mixed Group V precursors which improves uniformity of the layer, reduces manufacturing costs, and improves safety as compared to a layer grown only with the hydride Group V precursor.

In some aspects, the layer grown with the mixed Group V precursors has improved uniformity as compared to a layer grown only with the hydride Group V precursor. Advantageously, the uniformity (e.g., cross-wafer compositional uniformity, which translates into lasing wavelength uniformity) of the layer can improve by about 250%. For example, a cross-wafer wavelength standard deviation of about 3 nm or 0.23% at nominally the same wavelength (for example, about 1350 nm) for a layer grown only with the hydride Group V precursor can be reduced to a cross-wafer wavelength standard deviation of about less than 1 nm or <0.1% at nominally the same wavelength (for example, about 1350 nm) for a layer grown with the mixed Group V precursors.

In some aspects, the layer has a uniformity (e.g., cross-wafer compositional uniformity, which translates into lasing wavelength uniformity) having a cross-wafer wavelength standard deviation of less than 1 nm or <0.1% at nominally the same wavelength (for example, about 1350 nm).

In some aspects, the layer can include indium gallium arsenide (InGaAs), indium gallium phosphide (InGaP), gallium indium arsenide phosphide (GaInAsP), indium arsenide phosphide (InAsP), aluminum indium gallium arsenide phosphide (AlInGaAsP), or gallium arsenide phosphide (GaAsP). Advantageously, the layer can form a portion of a III-V semiconductor layered structure for high quality and high yield III-V semiconductor devices (e.g., HBTs, FETs, HFETs, HEMTs, PHEMTs, PIN diodes, APDs, EELs, DFBs, VCSELs, LEDs, or other electronic or photonic/optoelectronic devices).

In some aspects, a heterojunction bipolar transistor (HBT) can include the layered structure. Advantageously, the layered structure can form a high quality and high yield HBT devices.

In some aspects, a field effect transistor (FET), such as a heterostructure FET (HFET), high-electron-mobility transistor (HEMT), or pseudomorphic HEMT (PHEMT), can include the layered structure. Advantageously, the layered structure can form high quality and high yield FET devices (e.g., HFETs, HEMTs, PHEMTs, etc.).

In some aspects, a photonic device that emits or detects light can include the layered structure. Advantageously, the layered structure can form high quality and high yield photonic devices (e.g., PINs, APDs, DFBs, EELs, VCSELs, LEDs, or other optoelectronic devices).

Implementations of any of the techniques described above can include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
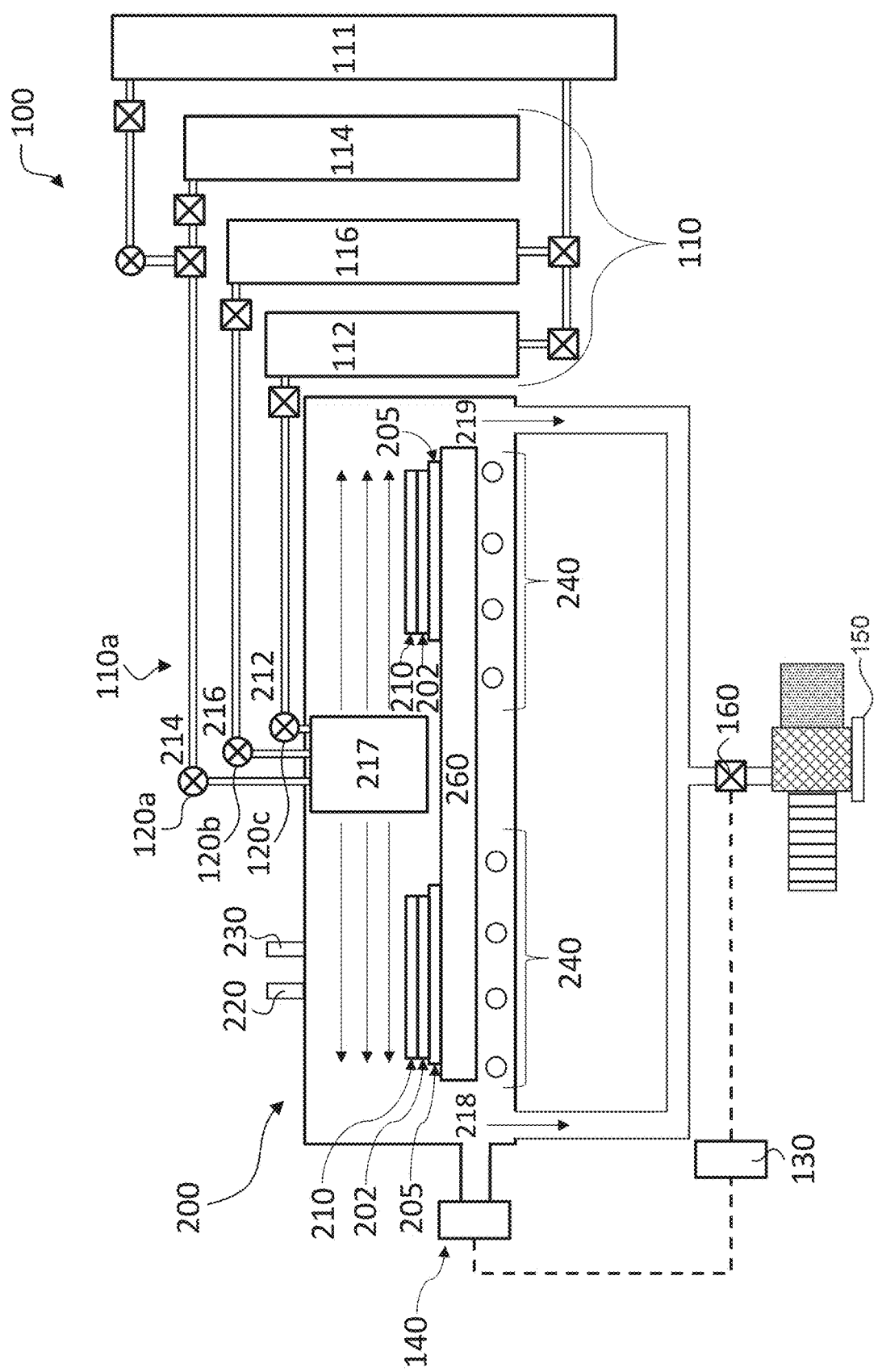
FIG. 1 is a schematic illustration of a reactor with a planetary reaction chamber, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described can include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to affect such feature, structure, or characteristic in connection with other aspects whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "about" or "substantially" or "approximately" as used herein means the value of a given quantity that can vary based on a particular technology. Based on the particular technology, the term "about" or "substantially" or "approximately" can indicate a value of a given quantity that varies within, for example, 0.1-10% of the value (e.g., ±0.1%, ±1%, ±2%, ±5%, or ±10% of the value).

The term "epitaxy" or "epitaxial" as used herein means crystalline growth of material, for example, via high temperature deposition. Epitaxy can be affected in a MBE tool in which layers are grown on a heated substrate in an ultra-high vacuum environment. Elemental sources are heated in furnaces and directed towards the substrate without carrier gases. The elemental constituents react at the substrate surface to create a deposited layer.

Epitaxy can also be performed in a metal-organic vapor phase epitaxy (MOVPE) tool, also known as a MOCVD tool. Compound metal-organic and hydride sources flow over a heated surface using a carrier gas, for example, hydrogen. Epitaxial deposition in the MOCVD tool occurs at higher pressures than in an MBE tool. The compound constituents are cracked in the gas phase and then reacted at the surface to grow layers of desired composition.

The term "substrate" as used herein means a planar wafer on which subsequent layers may be deposited, formed, or grown. A substrate may be formed of a single element (e.g., Si) or a compound material (e.g., GaAs), and may be doped or undoped. In some aspects, for example, a substrate can include Si, Ge, GaAs, GaN, GaP, GaSb, InP, InSb, a Group IV semiconductor, a Group III-V semiconductor, a Group II-VI semiconductor, graphene, silicon carbide (SiC), or sapphire.

A substrate may be on-axis, that is where the growth surface aligns with a crystal plane. For example, a substrate can have <100> crystal orientation. Reference herein to a substrate in a given crystal orientation also encompass a substrate which is miscut by up to about 20° towards another crystallographic direction. For example, a (100) substrate miscut towards the (111) plane.

The term "monolithic" as used herein means a layer or substrate comprising bulk (e.g., single) material throughout. Alternatively, the layer or substrate may be porous for some or all of its thickness.

The term "compound semiconductor material" or "Group III-V semiconductor" or "III-V semiconductor" or "III-V material" as used herein means including one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}Ga_{0.75}As$ means the Group III part comprises 25% Al, and thus 75% Ga, while the Group V part comprises 100% As.

The term "Group IV semiconductor" as used herein indicates comprising one or more materials from Group IV of the periodic table (e.g., group 14 elements: carbon (C), silicon (Si), germanium (Ge), tin (Sn), lead (Pb)).

The term "Group II-VI semiconductor" as used herein indicates comprising one or more materials from Group II of the periodic table (e.g., group 12 elements: zinc (Zn), cadmium (Cd), mercury (Hg)) with one or more materials from Group VI of the periodic table (e.g., group 16 elements: oxygen (O), sulfur (S), selenium (Se), tellurium (Te)).

The term "doping" or "doped" as used herein means that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein means a material or layer with a single crystal orientation. In epitaxial growth or deposition, subsequent layers with the same or similar lattice constant follow the registry of the previous crystalline layer and therefore grow with the same crystal orientation or crystallinity. As will be understood by a person of ordinary skill in the art, crystal orientation, for example, <100> means the face of cubic crystal structure and encompasses [100], [010], and [001] orientations using the Miller indices. Similarly, for example, <0001> encompasses [0001] and [000-1], except if the material polarity is critical. Also, integer multiples of any one or more of the indices are equivalent to the unitary version of the index. For example, (222) is equivalent to (111).

The term "lattice matched" as used herein means that two crystalline layers have the same, or similar, lattice spacing such that the second layer will tend to grow isomorphically (e.g., same crystalline form) on the first layer.

The term "lattice constant" as used herein means the unstrained lattice spacing of the crystalline unit cell.

The term "lattice coincident" as used herein means that a crystalline layer has a lattice constant which is, or is close to, an integer multiple of the previous layer so that the atoms can be in registry with the previous layer.

The term "deposition" as used herein means the depositing of a layer on another layer or substrate. Deposition encompasses epitaxy, PVD, CVD, powder bed deposition, and/or other known techniques to deposit material in a layer.

The term "lateral" or "in-plane" as used herein means parallel to the surface of the substrate and perpendicular to the growth direction.

The term "vertical" or "out-of-plane" as used herein means perpendicular to the surface of the substrate and in the growth direction.

The term "III-V ratio" or "III-V ratios" as used herein means a pressure ratio of Group III to Group V species, a growth rate ratio of Group III to Group V species, and/or a flux ratio of Group III to Group V species.

The term "cross-wafer wavelength standard deviation" or "cross-wafer compositional uniformity" as used herein means a standard deviation ($\sigma$) defined as $$\sigma = \sqrt{\frac{\sum (x_i - \mu)^2}{N}}$$

where $\sigma$=population standard deviation
N=size of population
$x_i$=each value from population
$\mu$=the population mean.

The standard deviation represents the variability of wavelength. Since wavelength is a function of the material composition, the standard deviation characterizes the composition variation across the wafer.

Numerical values, including endpoints of ranges, can be expressed herein as approximations preceded by the term "about," "substantially," "approximately," or the like. In such cases, other aspects include the particular numerical values. Regardless of whether a numerical value is expressed as an approximation, two aspects are included in this disclosure: one expressed as an approximation, and another not expressed as an approximation. It will be further understood that an endpoint of each range is significant both in relation to another endpoint, and independently of another endpoint.

Exemplary Reactors

As discussed above, epitaxy can be used to grow high quality, single crystal III-V semiconductors, which can be used for electronic and optoelectronic devices. Such devices find application in RF/wireless communication, tele and data communication, 3D sensing and power electronics. Epitaxy can include molecular beam epitaxy (MBE) or metal-organic vapor phase epitaxy (MOVPE), also known as metal-organic chemical vapor deposition (MOCVD). In MBE, a source material is heated to produce an evaporated beam of atoms/molecules in an ultra-high vacuum (e.g., about $10^{-9}$ torr) that can condense onto a heated substrate. Elemental sources can be heated (e.g., in furnaces) and directed towards the substrate without carrier gases (e.g., $H_2$), and the elemental constituents can react at the substrate surface to form an epitaxial layer. The elemental beams are turned on and off through the use of shutters.

In MOCVD, hydride and/or metal-organic sources (e.g., precursors) can flow over a heated substrate in a reaction chamber using a carrier gas (e.g., $H_2$) to decompose the compound precursors. The compound precursors are decomposed (e.g., cracked, pyrolised) in the gas phase into their constituent elements and then reacted at the substrate surface to form an epitaxial layer. The cracking and subsequent reaction of the precursors can be dependent upon the precursor concentration, the substrate temperature, the flowing gas temperature, the precursor pressure, and/or the reaction chamber pressure.

In order to maintain uniformity throughout the formed epitaxial layer, the reaction environment needs to be optimized and highly controlled at each point across the substrate surface. Different precursors decompose (e.g., crack) and react at different temperatures and can have different concentration profiles across the substrate surface. In general, Group III precursors are reasonably manageable since almost all decompose above a critical temperature (e.g., cracking efficiency is about 100%) and the corresponding concentration profiles are relatively uniform.

However, Group V precursors are more complex and the cracking temperature and efficiency can vary considerably for each Group V precursor. Further, III-V semiconductors are generally formed in an excess Group V environment that can further complicate Group V conditions in the reaction chamber. Additionally, the situation is further complicated for mixed Group V materials, where the Group V sublattice includes at least two Group V elements (e.g., $GaAsP_{1-x}$, $In_yGa_{1-y}As_zP_{1-z}$).

Two classes of Group V materials used in epitaxy processes (e.g., MOCVD) include hydride precursors and metal-organic precursors. Hydride precursors include a Group V element bonded to hydrogen (e.g., phosphine ($PH_3$), arsine ($AsH_3$)). Metal-organic precursors include a Group V element bonded to hydrocarbon ligands (e.g., tertiary-butyl phosphine (TBP) ($C_{12}H_{27}P$), trimethyl arsine (TMA) ($C_3H_9As$)). The selection of Group V precursors depends on many factors including availability, purity, cost, and/or safety.

For safety reasons, metal-organic Group V precursors are preferable to hydride Group V precursors. Metal-organic Group V precursors can provide better uniformity, but at the expense of greater cost, more impurities, and inherent carbon (C) doping. For example, the concentration of undesirable contaminants (e.g., oxygen and/or sulphur) in metal-organic Group V precursors can be significantly higher than in hydride Group V precursors which can decrease the quality and purity of a formed epitaxial layer. Further, metal-organic Group V precursors include an inherent carbon (C) subspecies that can dope the formed layer and may be unacceptable for certain devices.

Aspects of mixed Group V precursor apparatuses, systems, and methods as discussed below can improve uniformity of an epitaxial layer, normalize concentration/incorporation profiles of precursors, improve on-wafer yield (e.g., via improved cross-wafer uniformity), improve wafer-to-wafer yield (e.g., via reduced mean wavelength variation wafer to wafer), increase manufacturing efficiency, improve control of III-V ratios (e.g., pressure, growth rate, flux), and reduce manufacturing costs (e.g., minimize the amount of metal-organic precursors needed). Further, aspects of mixed Group V precursors in a planetary reaction chamber (e.g., MOCVD) can provide a multiple-zone nozzle for different Group V precursors in different zones, enable control of when a specific Group V precursor enters a boundary layer and/or a reaction zone at a surface, and finely tune reaction kinetics at the surface and thereby control layer composition and uniformity.

FIG. 1 illustrates reactor 100 with planetary reaction chamber 200, according to an exemplary aspect. Reactor 100 can be configured to grow or deposit one or more epitaxial layers (e.g., epitaxial layer 210, layered structure 600) in planetary reaction chamber 200 based on one or more material sources. In some aspects, reactor 100 can be for metal-organic chemical vapor deposition (MOCVD). Although reactor 100 is shown in FIG. 1 as a stand-alone apparatus and/or system, aspects of this disclosure can be used with other apparatuses, systems, and/or methods.

As shown in FIG. 1, reactor 100 can include precursor sources 110 (e.g., precursor manifold), precursor lines 110a (e.g., Group III precursor inlet 212, hydride Group V precursor inlet 214, metal-organic Group V precursor inlet 216), mass flow controllers 120a, 120b, 120c, pressure controller 130, pressure sensor 140, vacuum pump 150, throttle valve 160, and planetary reaction chamber 200. Precursor sources 110 can be configured to provide one or more precursors into planetary reaction chamber 200 (e.g., via mass flow controllers 120a, 120b, 120c) to react (e.g., decompose) at substrate 202 to form epitaxial layer 210. Precursor sources 110 can include Group III precursor 112, hydride Group V precursor 114, and metal-organic Group V precursor 116.

In some aspects, Group III precursor 112 can include metal-organic Group III precursors (e.g., trimethyl aluminum (TMA) ($Al_2(CH_3)_6$), triethyl aluminum (TEA) ($Al_2(C_2H_5)_6$), trimethyl gallium (TMG) ($Ga(CH_3)_3$), triethyl gallium (TEG) ($Ga(C_2H_5)_3$), trimethyl indium (TMI) ($In(CH_3)_3$), triethyl indium (TEI) ($InC_6H_{15}$), etc.). In some aspects, hydride Group V precursor 114 can include phosphine ($PH_3$), arsine ($AsH_3$), ammonia ($NH_3$), stibine ($SbH_3$), or bismuthine ($BiH_3$).

In some aspects, metal-organic Group V precursor 116 can include tertiary-butyl phosphine (TBP) ($C_{12}H_{27}P$), bisphosphinoethane (BPE) ($C_2H_8P_2$), trimethyl arsine (TMA) ($C_3H_9As$), tertiary-butyl arsine (TBA) ($C_4H_{11}As$), monoethyl arsine (MEA) ($C_2H_5As$), tertiary-butyl amine (TBAm) ($C_4H_{11}N$), dimethylhydrazine (DMHy) ($C_2H_8N_2$), phenylhydrazine ($C_6H_8N_2$), trimethyl antimony (TMSb) ($C_3H_9Sb$), triethyl antimony (TESb) ($C_6H_{15}Sb$), tri-isopropyl antimony (TIPSb) ($C_9H_{21}Sb$), or a bismuth metal-organic framework (Bi-MOF).

In all cases, the precursors 112, 114, and 116 are transported to the growth environment using a carrier gas 111 (e.g., $H_2$). For metal-organic sources, this is achieved by bubbling the hydrogen through the source reagent to effect "pick up." For hydride precursors, the precursor and carrier gas are combined after the hydride gas leaves a high pressure cylinder.

Mass flow controllers 120a, 120b, 120c can be configured to measure and control the flow of precursor sources 110 (e.g., Group III precursor 112, hydride Group V precursor 114, metal-organic Group V precursor 116) to planetary reaction chamber 200. As shown in FIG. 1, a mass flow controller 120a, 120b, 120c can regulate a flow rate (e.g., volume/time) of each precursor sources 110 into planetary reaction chamber 200. In some aspects, for example, mass flow controller 120a can regulate a flow rate of hydride Group V precursor inlet 214, mass flow controller 120b can regulate a flow rate of metal-organic Group V precursor inlet 216, and mass flow controller 120c can regulate a flow rate of Group III precursor inlet 212. In some aspects, a flow rate of precursor sources 110 can be about 50 cc/min to about 1500 cc/min. For example, metal-organic Group V precursor 116 can have a flow rate of about 350 cc/min to about 750 cc/min.

Figure 2A:
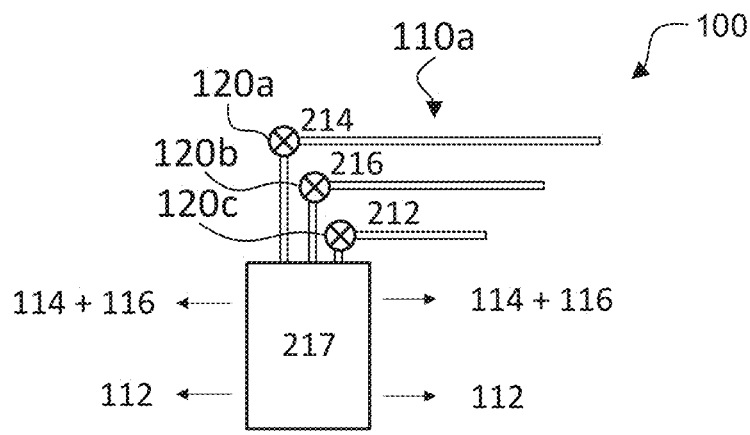
FIGS. 2A-2C are schematic illustrations of different possibilities for the equipment configuration needed to deliver the precursor combinations for the reactor shown in FIG. 1, according to exemplary aspects.
Figure 2B:
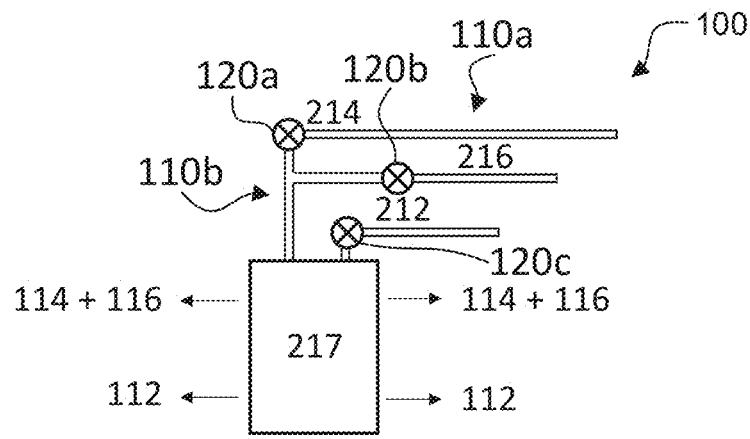
Figure 3A:
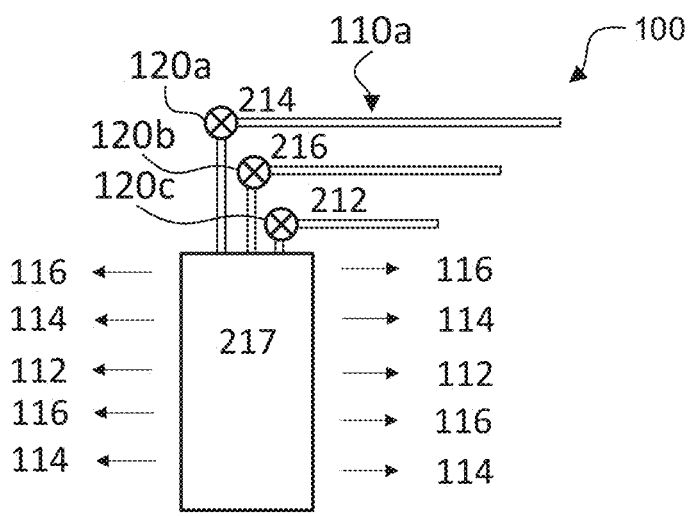
FIGS. 3A-3C are schematic illustrations of different possibilities for the equipment configuration needed to deliver the precursor combinations for the reactor shown in FIG. 1, according to exemplary aspects.
Figure 3B:
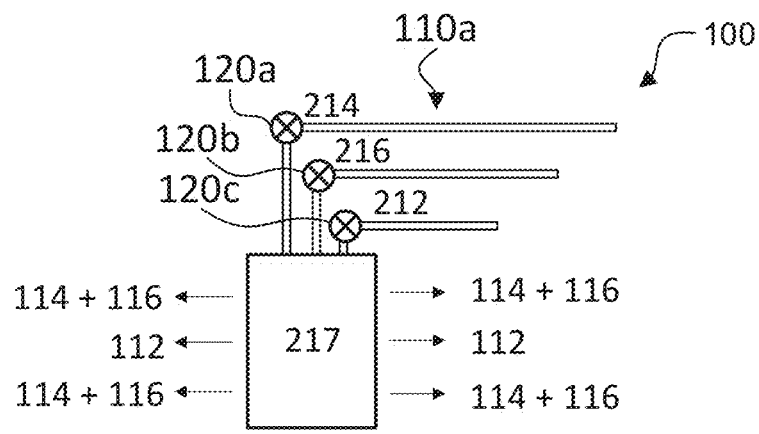
Figure 3C:
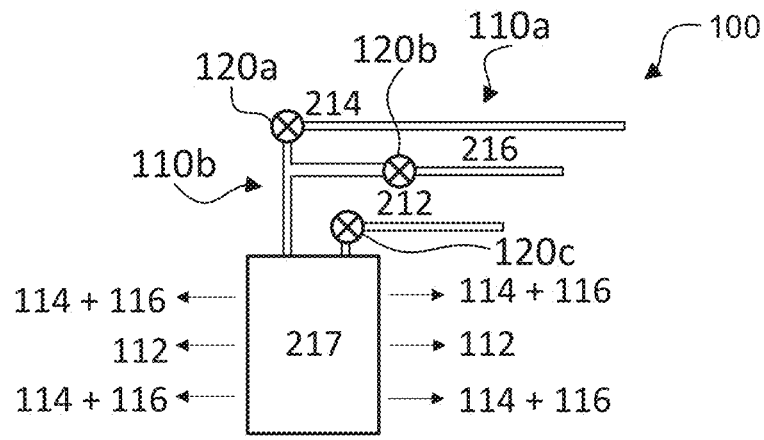

In some aspects, mass flow controllers 120a, 120b can mix hydride Group V precursor 114 and metal-organic Group V precursor 116, for example, as shown in FIGS. 2B and 3C, to form a mixed Group V precursor (e.g., mixed Group V precursors 522 shown in FIG. 5) before flowing into planetary reaction chamber 200. In some aspects, mass flow controllers 120a, 120b can control a mass concentration ratio between hydride Group V precursor 114 and metal-organic Group V precursor 116. For example, mass flow controllers 120a, 120b can adjust the mass concentration ratio (i.e., metal-organic:hydride) to 50:50, 40:60, 30:70, or 20:80.

Pressure controller 130 can be configured to control the pressure precursor sources 110 inside the planetary reaction chamber 200. As shown in FIG. 1, pressure controller 130 can be coupled to pressure sensor 140 (e.g., Baratron® manometer) and throttle valve 160. Pressure sensor 140 can be configured to measure a pressure inside planetary reaction chamber 200. Throttle valve 160 can be configured to be modulated according to the measurement of the pressure sensor 140 and thereby adjust the vacuum (e.g., negative pressure) applied by vacuum pump 150, thereby controlling the pressure in the planetary reaction chamber 200. Vacuum pump 150 can be configured to apply a vacuum (~50 mbar-500 mbar) to planetary reaction chamber 200. In some aspects, planetary reaction chamber 200 can have a pressure of about 50 mbar to about 150 mbar. For example, during low-pressure MOCVD, planetary reaction chamber 200 can have a pressure of about 100 mbar. In some aspects, planetary reaction chamber 200 can have a pressure of about 1 atm to about 35 atm. For example, during high-pressure MOCVD, planetary reaction chamber 200 can have a pressure of about 1 atm to about 5 atm.

Planetary reaction chamber 200 can be configured to react (e.g., decompose) precursor sources 110 at high temperature to form epitaxial layer 210. As shown in FIG. 1, planetary reaction chamber 200 can include substrate 202, susceptor 205, epitaxial layer 210, Group III precursor inlet 212, hydride Group V precursor inlet 214, metal-organic Group V precursor inlet 216, nozzle 217, optical source 220, optical detector 230, radio frequency (RF) coils 240, and planet 260. In some aspects, substrate 202 can include a wafer, for example, a III-V substrate. In some aspects, substrate 202 can be heated to high temperature (e.g., about 450° C. to about 750° C.) to promote decomposition (e.g., cracking) of precursor sources 110 that are then reacted to achieve epitaxial growth using the constituent elements. For example, substrate 202 can be heated to about 600° C. to about 650° C. In some aspects, substrate 202 can be disposed on and separate from susceptor 205 (e.g., a graphite pedestal).

Figure 4:
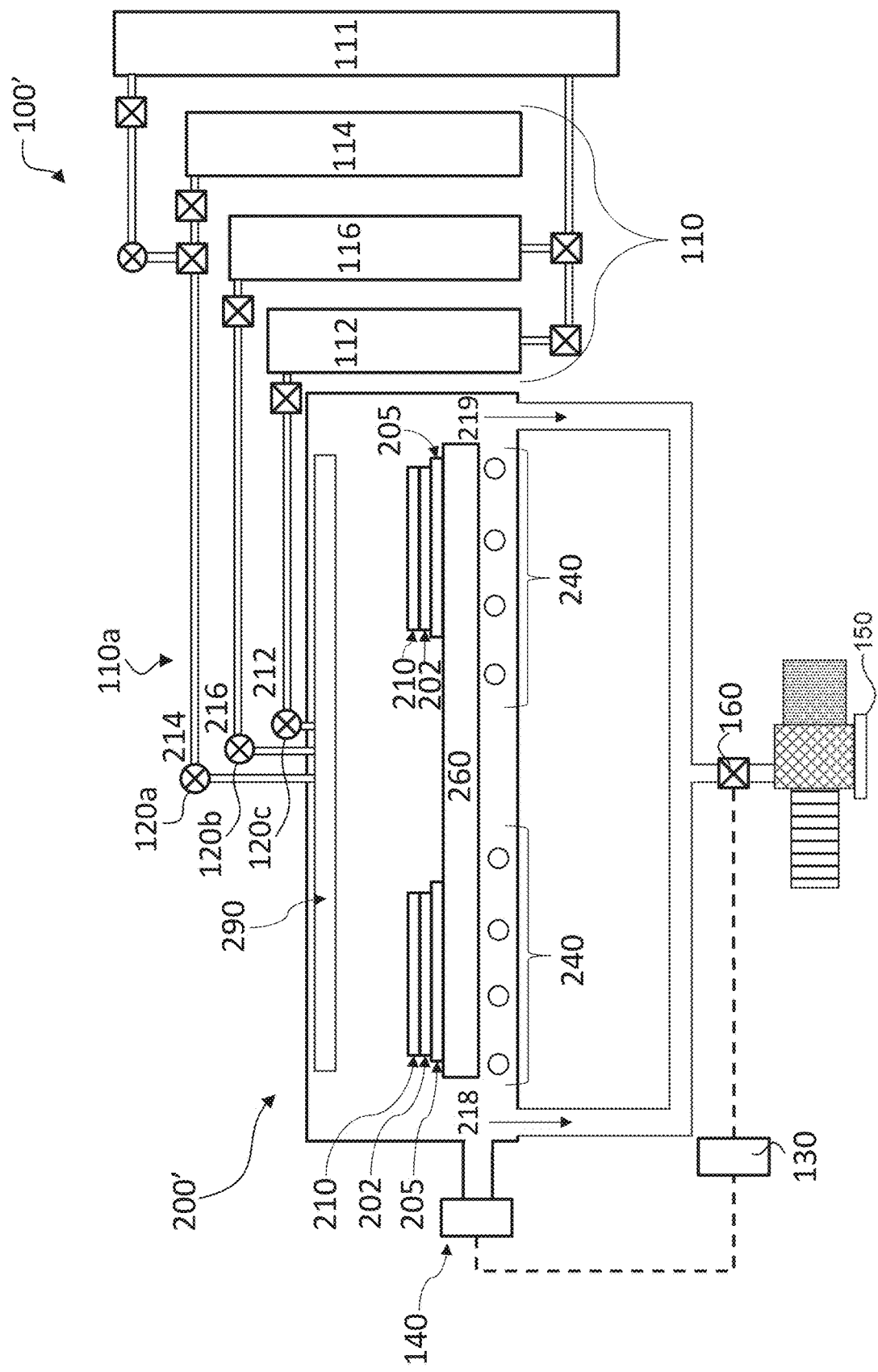
FIG. 4 is a schematic illustration of a reactor with a close-coupled showerhead reaction chamber, according to an exemplary aspect.

In some aspects, reactor 100 can include a showerhead reaction chamber. For example, as shown in FIG. 4, reactor 100' can include a close-coupled showerhead reaction chamber 200' with a showerhead 290 (e.g., multi-zone showerhead) for three material source inlets (e.g., Group III precursor inlet 212, hydride Group V precursor inlet 214, metal-organic Group V precursor inlet 216). The aspects of reactor 100 shown in FIGS. 1, 2A-2C, and 3A-3C, for example, and the aspects of reactor 100' shown in FIG. 4 may be similar. Similar reference numbers are used to indicate features of the aspects of reactor 100 shown in FIGS. 1, 2A-2C, and 3A-3C and the similar features of the aspects of reactor 100' shown in FIG. 4.

Exemplary Reaction Chambers

FIGS. 1 and 4 illustrate reaction chambers 200, 200', according to various exemplary aspects. FIG. 1 shows planetary reaction chamber 200. FIG. 4 shows close-coupled showerhead reaction chamber 200'. Although reaction chambers 200, 200' are shown in FIGS. 1 and 4, respectively, as stand-alone apparatuses and/or systems, the aspects of this disclosure can be used with other apparatuses, systems, and/or methods. Reaction chambers 200, 200' can be configured to receive and react (e.g., decompose) precursor sources 110 at high temperature in reactor 100, 100' to form epitaxial layer 210.

As shown in FIG. 1, planetary reaction chamber 200 can include substrate 202, susceptor 205, epitaxial layer 210, Group III precursor inlet 212, hydride Group V precursor inlet 214, metal-organic Group V precursor inlet 216, nozzle 217, first outlet 218, second outlet 219, optical source 220, optical detector 230, RF coils 240, and planet 260. Group III precursor inlet 212, hydride Group V precursor inlet 214, metal-organic Group V precursor inlet 216 can flow precursor sources 110 into planetary reaction chamber 200 through nozzle 217 and onto substrate 202 to form epitaxial layer 210. In some aspects, Group III precursor inlet 212 can flow Group III precursor 112 into planetary reaction chamber 200 (e.g., via nozzle 217). In some aspects, hydride Group V precursor inlet 214 can flow hydride Group V precursor 114 into planetary reaction chamber 200 (e.g., via nozzle 217). In some aspects, metal-organic Group V precursor inlet 216 can flow metal-organic Group V precursor 116 into planetary reaction chamber 200 (e.g., via nozzle 217).

In some aspects, hydride Group V precursor inlet 214 (e.g., hydride Group V precursor 114) and metal-organic Group V precursor inlet 216 (e.g., metal-organic Group V precursor 116) flows can be mixed before nozzle 217, at nozzle 217, and/or in planetary reaction chamber 200. For example, as shown in FIG. 1, the mixture formed at nozzle 217 can be formed from hydride Group V precursor inlet 214 and metal-organic Group V precursor inlet 216. In some aspects, first and second outlets 218, 219 can be combined and flow to vacuum pump 150 (e.g. via throttle valve 160). Throttle valve 160 can be modulated by pressure controller 130 (e.g., via a control signal) that is representative of a pressure read by pressure sensor 140. As such, the level of vacuum applied by vacuum pump 150 is modulated by throttle valve 160 to achieve the desired pressure in planetary reactor chamber 200 as read by pressure sensor 140.

In some aspects, planetary reaction chamber 200 can include optical source 220 and optical detector 230 configured to measure one or more properties (e.g., uniformity, thickness, temperature, etc.) of epitaxial layer 210. For example, as shown in FIG. 1, optical source 220 can be arranged to illuminate epitaxial layer 210 and detector 230 can be arranged to measure the resultant signal. In some aspects, optical source 220 can include an illuminator (e.g., coherent laser beam), a lens, and/or a polarizer. In some aspects, optical detector 230 can include a charge-coupled device (CCD), photodetector, photodiode, avalanche photodiode (APD), and/or any other optical detector capable of detecting scattered light from epitaxial layer 210. In some aspects, planetary reaction chamber 200 can include RF coils 240 for RF heating. For example, as shown in FIG. 1, RF coils 240 can reside under planet 260 to effect heating of susceptor 205, substrate 202, and epitaxial layer 210.

Figure 2C:
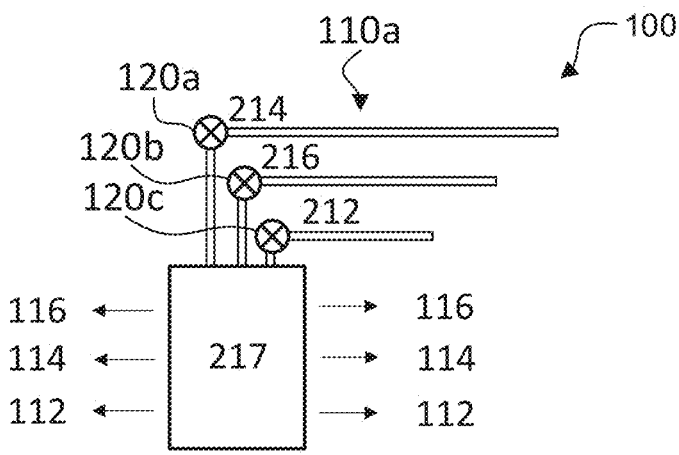

FIGS. 2A-2C illustrate various precursor combinations in reactor 100 shown in FIG. 1 to form epitaxial layer 210, according to exemplary aspects. In some aspects, hydride Group V precursor inlet 214 (e.g., hydride Group V precursor 114) and metal-organic Group V precursor inlet 216 (e.g., metal-organic Group V precursor 116) flows in precursor lines 110a can be mixed at nozzle 217 with Group III precursor inlet 212 (e.g., Group III precursor 112). For example, as shown in FIG. 2A, the precursor mixture formed at nozzle 217 can be formed from mixed hydride and metal-organic Group V precursors 114, 116 and Group III precursor 112. In some aspects, hydride Group V precursor inlet 214 (e.g., hydride Group V precursor 114) and metal-organic Group V precursor inlet 216 (e.g., metal-organic Group V precursor 116) flows in precursor lines 110a can be mixed before nozzle 217 (e.g., at precursor mixing lines 110b) and separate from Group III precursor inlet 212 (e.g., Group III precursor 112). For example, as shown in FIG. 2B, hydride Group V precursor inlet 214 and metal-organic Group V precursor inlet 216 can be mixed in precursor mixing lines 110b after mass flow controllers 120a, 120b and prior to nozzle 217. In some aspects, hydride Group V precursor inlet 214 (e.g., hydride Group V precursor 114), metal-organic Group V precursor inlet 216 (e.g., metal-organic Group V precursor 116), and Group III precursor inlet 212 (e.g., Group III precursor 112) flows in precursor lines 110a can be introduced separately into planetary reaction chamber 200 by nozzle 217. For example, as shown in FIG. 2C, hydride Group V precursor 114, metal-organic Group V precursor 116, and Group III precursor 112 can be separately (e.g., individually) introduced by nozzle 217.

FIGS. 3A-3C illustrate various precursor combinations in reactor 100 shown in FIG. 1 to form epitaxial layer 210, according to exemplary aspects. In some aspects, hydride Group V precursor inlet 214 (e.g., hydride Group V precursor 114), metal-organic Group V precursor inlet 216 (e.g., metal-organic Group V precursor 116), and Group III precursor inlet 212 (e.g., Group III precursor 112) flows in precursor lines 110a can be introduced separately into planetary reaction chamber 200 by nozzle 217 with twice as much hydride and metal-organic Group V precursors 114, 116 as Group III precursor 112. For example, as shown in FIG. 3A, twice as much (e.g., mass concentration ratio 2:1) hydride and metal-organic Group V precursors 114, 116 as Group III precursor 112 can be separately (e.g., individually) introduced by nozzle 217. In some aspects, hydride Group V precursor inlet 214 (e.g., hydride Group V precursor 114) and metal-organic Group V precursor inlet 216 (e.g., metal-organic Group V precursor 116) flows in precursor lines 110a can be mixed at nozzle 217 with Group III precursor inlet 212 (e.g., Group III precursor 112) with twice as much mixed hydride and metal-organic Group V precursors 114, 116 as Group III precursor 112. For example, as shown in FIG. 3B, twice as much (e.g., mass concentration ratio 2:1) mixed hydride and metal-organic Group V precursors 114, 116 as Group III precursor 112 can be formed at nozzle 217. In some aspects, hydride Group V precursor inlet 214 (e.g., hydride Group V precursor 114) and metal-organic Group V precursor inlet 216 (e.g., metal-organic Group V precursor 116) flows in precursor lines 110a can be mixed before nozzle 217 (e.g., at precursor mixing lines 110b) and separate from Group III precursor inlet 212 (e.g., Group III precursor 112) with twice as much mixed hydride and metal-organic Group V precursors 114, 116 as Group III precursor 112. For example, as shown in FIG. 3C, hydride Group V precursor inlet 214 and metal-organic Group V precursor inlet 216 can be mixed in precursor lines 110a after mass flow controllers 120a, 120b and prior to nozzle 217 (e.g., at precursor mixing lines 110b) and twice as much (e.g., mass concentration ratio 2:1) mixed hydride and metal-organic Group V precursors 114, 116 as Group III precursor 112 can be introduced by nozzle 217.

As shown in FIG. 4, reactor 100' can include close-coupled showerhead reaction chamber 200' with showerhead 290, according to an exemplary aspect. The aspects of planetary reaction chamber 200 shown in FIG. 1, for example, and the aspects of close-coupled showerhead reaction chamber 200' shown in FIG. 4 may be similar. Similar reference numbers are used to indicate features of the aspects of planetary reaction chamber 200 shown in FIG. 1 and the similar features of the aspects of close-coupled showerhead reaction chamber 200' shown in FIG. 4. Precursors 112, 114, 116 are introduced into close-coupled showerhead reactor chamber 200' through showerhead 290. As such showerhead 290 replaces nozzle 217 of planetary reaction chamber 200 shown in FIG. 1. The other aspects as discussed for reactor 100 shown in FIG. 1 remain conceptually the same. It is noted that FIG. 4 has been simplified to show a single reagent supply to close-coupled showerhead reaction chamber 200' via Group III precursor inlet 212, hydride Group V precursor inlet 214, and metal-organic Group V precursor inlet 216. In some aspects, multiple inlets across showerhead 290 can be used in order to improve cross-wafer compositional uniformity.

Exemplary Epitaxy Process with Mixed Group V Precursors

Figure 5:
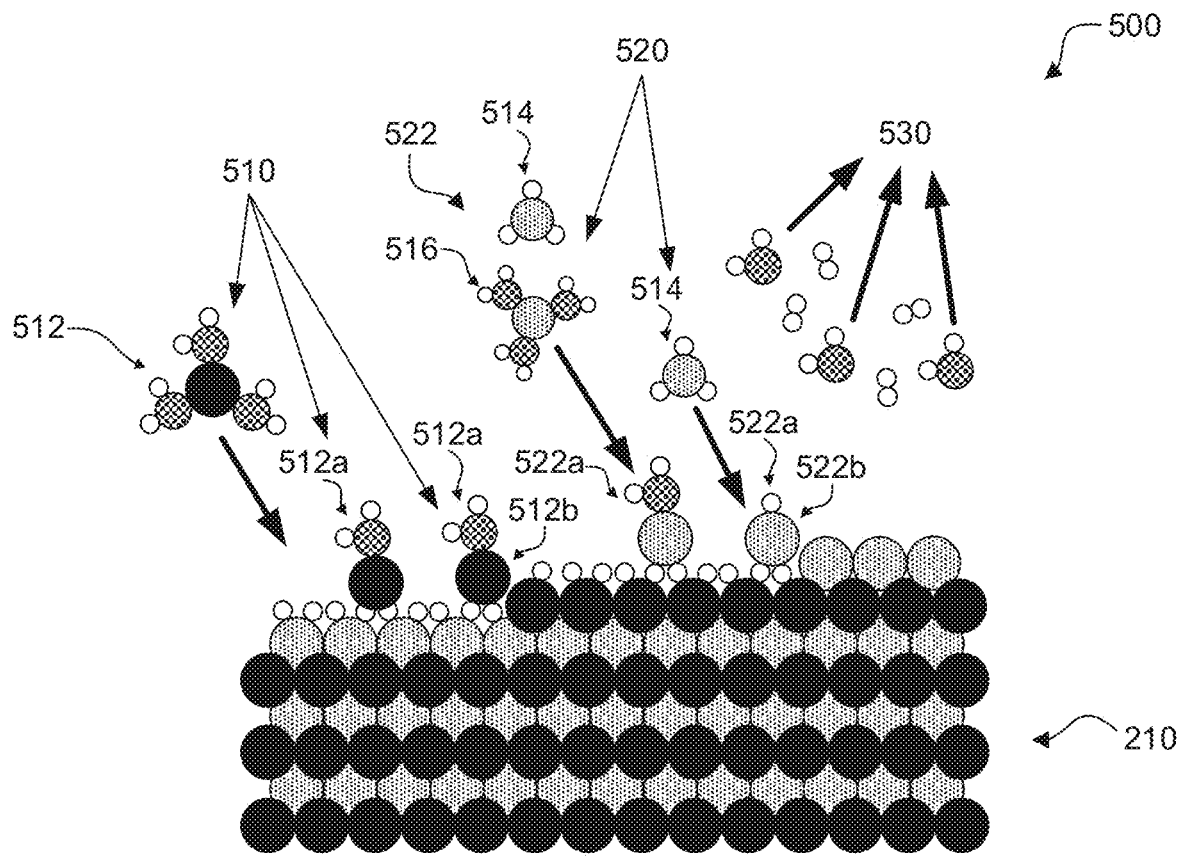
FIG. 5 is a schematic illustration of an epitaxy process to form an epitaxial layer in the reactors shown in FIGS. 1 and 4, according to an exemplary aspect.
Figure 7:
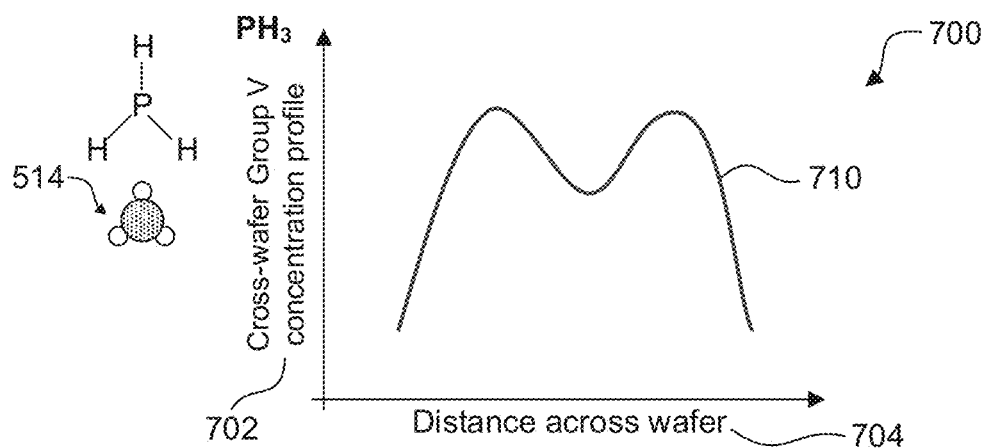
FIG. 7 is a schematic plot of a hydride Group V precursor cross-wafer Group V concentration profile, according to an exemplary aspect.
Figure 8:
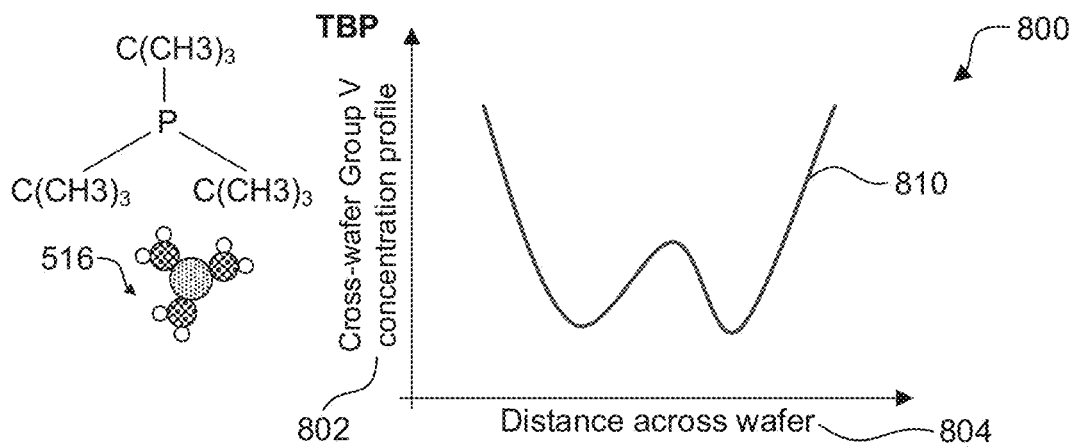
FIG. 8 is a schematic plot of a metal-organic Group V precursor cross-wafer Group V concentration profile, according to an exemplary aspect.
Figure 9:
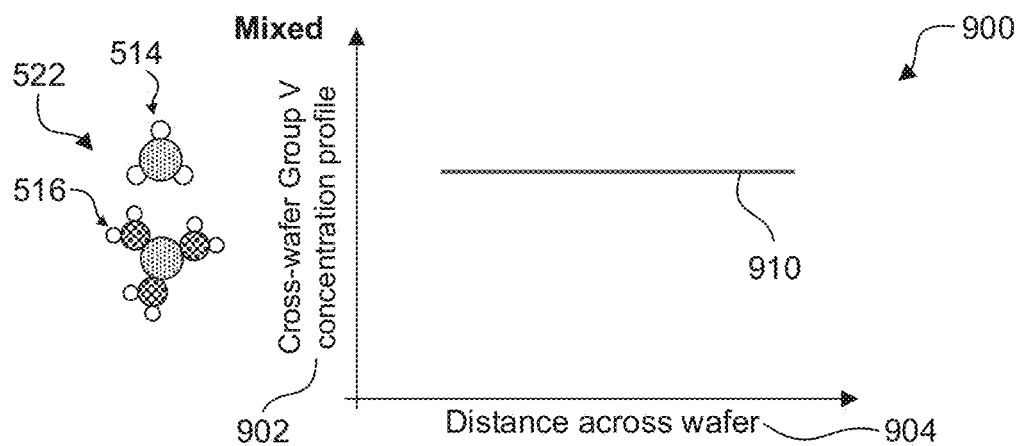
FIG. 9 is a schematic plot of a mixed Group V precursors cross-wafer Group V concentration profile, according to an exemplary aspect.

FIGS. 5-12 illustrate epitaxy process 500, according to various exemplary aspects. FIG. 5 illustrates epitaxy process 500 to form epitaxial layer 210 in reactor 100 or 100' shown in FIGS. 1 and 4. Although epitaxy process 500 is shown in FIG. 5, as a stand-alone apparatus, system, and/or method, the aspects of this disclosure can be used with other apparatuses, systems, and/or methods. Epitaxy process 500 can react mixed Group V precursors 522 with Group III precursor 512 to form epitaxial layer 210 and improve uniformity, decrease manufacturing cost, and improve safety. Epitaxy process 500 can be tuned to decrease sensitivity to cross-wafer thermal variations in reaction chamber 200, 200' to achieve a uniform concentration profile (e.g., concentration profile plot 910 shown in FIG. 9 compared to concentration profile plot 710 shown in FIG. 7 and concentration profile plot 810 shown in FIG. 8).

As shown in FIG. 5, epitaxy process 500 can include Group III precursor reaction 510, mixed Group V precursors reaction 520, and reaction by-products 530. Group III precursor reaction 510 can provide a Group III element (e.g., Al, Ga, In) in a new epitaxial sublayer of epitaxial layer 210. Group III precursor reaction 510 can include Group III precursor 512, Group III precursor subspecies 512a, and Group III lattice step edge incorporation 512b.

During Group III precursor reaction 510, Group III precursor 512 undergoes decomposition (e.g., cracking, pyrolysis) as it approaches epitaxial layer 210. Group III precursor 512 decomposes to Group III precursor subspecies 512a, which absorbs onto the surface of epitaxial layer 210 at Group III lattice step edge (e.g., 512b). Group III lattice step edge incorporation 512b enables the reaction of the Group III element (e.g., Al, Ga, In) with a Group V element (e.g., As, P, N, Sb, Bi) to form a new epitaxial layer of epitaxial layer 210. Reaction by-products 530 remaining from decomposition of Group III precursor 512 are removed from reaction chamber 200, 200'.

Mixed Group V precursors reaction 520 can be configured to provide a Group V element (e.g., P, As, N, Sb, Bi) in a new epitaxial sublayer of epitaxial layer 210. Mixed Group V precursors reaction 520 can be further configured to decrease concentration variations across the wafer 202 to normalize concentration profile of Group V to achieve profile 910 shown in FIG. 9. Mixed Group V precursors reaction 520 can include hydride Group V precursor 514, metal-organic Group V precursor 516, mixed Group V precursors 522, mixed Group V precursor subspecies 522a, and mixed Group V lattice step edge incorporation 522b.

During mixed Group V precursors reaction 520, hydride Group V precursor 514 and metal-organic Group V precursor 516 mix to form mixed Group V precursors 522. Mixed Group V precursors 522 undergo decomposition (e.g., cracking, pyrolysis) as they approach epitaxial layer 210. Mixed Group V precursors 522 decompose to mixed Group V precursors 522 subspecies 522a, which absorbs onto the surface of epitaxial layer 210 at mixed Group V lattice step edge (e.g., 522b). Mixed Group V lattice step edge incorporation 522b enables the reaction of the Group V element (e.g., P, As, N, Sb, Bi) with a Group III element (e.g., Al, Ga, In) to form a new epitaxial layer of epitaxial layer 210. Reaction by-products 530 remaining from decomposition of Group V precursor 520 are removed from reaction chamber 200, 200'.

In some aspects, mixed Group V precursors 522 can include phosphine ($PH_3$) and tertiary-butyl phosphine (TBP) ($C_{12}H_{27}P$). In some aspects, mixed Group V precursors 522 can include arsine ($AsH_3$) and trimethyl arsine (TMA) ($C_3H_9As$). In some aspects, mixed Group V precursors 522 can include ammonia ($NH_3$) and dimethylhydrazine (DMHy) ($C_2H_8N_2$). In some aspects, mixed Group V precursors 522 can include stibine ($SbH_3$) and trimethyl antimony (TMSb) ($C_3H_9Sb$). In some aspects, mixed Group V precursors 522 can include bismuthine ($BiH_3$) and a bismuth metal-organic framework (Bi-MOF).

Figure 6:
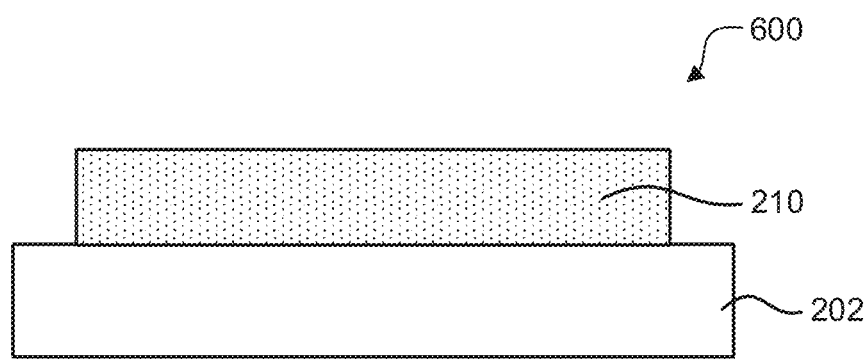
FIG. 6 is a schematic cross-sectional illustration of a layered structure formed from the epitaxy process shown in FIG. 5, according to an exemplary aspect.

The combination of Group III precursor reaction 510 and mixed Group V precursors reaction 520 forms epitaxial layer 210. In some aspects, epitaxy process 500 can be performed on a substrate to form epitaxial layer 210. For example, as shown in FIG. 6, epitaxial layer 210 can be formed on substrate 202. In some aspects, epitaxy process 500 can be used to form one or more epitaxial layers 210. For example, as shown in FIG. 6, epitaxy process 500 can be used to form epitaxial layer 210 on substrate 202.

In some aspects, epitaxial layer 210 can have a uniformity that is higher than a uniformity of a layer having a III-V material grown only with hydride Group V precursor 514, rather than mixed Group V precursors 522. For example, the uniformity (e.g., cross-wafer compositional uniformity, which translates into lasing wavelength uniformity) of epitaxial layer 210 can improve by about 250%. For example, a cross-wafer standard deviation of about 3 nm or 0.23% at nominally the same wavelength (for example, about 1350 nm) for an epitaxial layer grown only with hydride Group V precursor 514 can be reduced to a cross-wafer standard deviation of about less than 1 nm or <0.1% at nominally the same wavelength (for example, about 1350 nm) for epitaxial layer 210 grown with mixed Group V precursors 522. In some aspects, epitaxial layer 210 can include any III-V semiconductor. For example, epitaxial layer 210 can include indium gallium arsenide (InGaAs), indium gallium phosphide (InGaP) gallium indium arsenide phosphide (GaInAsP), indium arsenide phosphide (InAsP), aluminum indium gallium arsenide phosphide (AlInGaAsP), or gallium arsenide phosphide (GaAsP).

FIG. 6 illustrates layered structure 600 formed from epitaxy process 500 shown in FIG. 5. Although layered structure 600 is shown in FIG. 6, as a stand-alone apparatus and/or system, the aspects of this disclosure can be used with other apparatuses, systems, and/or methods. Layered structure 600 can be configured to form a III-V semiconductor layered structure for high quality and high yield devices (e.g., HBTs, FETs, HFETs, HEMTs, PHEMTs, PIN diodes, APDs, EELs, DFBs, VCSELs, LEDs, or other electronic or photonic/optoelectronic devices).

In some aspects, layered structure 600 formed from epitaxy process 500 can be part of a device (e.g., HBT, FET, HFET, HEMT, PHEMT, PIN diode, APD, EEL, DFB, VCSEL, LED, or other electronic or photonic/optoelectronic device). For example, a HBT can include layered structure 600. For example, a FET, such as a HFET, a HEMT, or a PHEMT, can include layered structure 600. For example, a photonic device that emits or detects light can include layered structure 600.

FIGS. 7-9 illustrate plots of cross-wafer Group V element concentration distributions 700, 800, 900 of epitaxy process 500 for different Group V precursors/mixtures. Although Group V elemental cross-wafer concentration distributions 700, 800, 900 are shown in FIGS. 7-9, as stand-alone plots, the aspects of this disclosure can be used with other apparatuses, systems, and/or methods. Only using a single type of Group V precursor (either solely hydride or solely metal organic) results in a cross-wafer concentration variation (e.g., cross-wafer Group V element concentration distribution 700 shown in FIG. 7 and cross-wafer Group V element concentration distribution 800 shown in FIG. 8) due to the cross-wafer thermal variation. This is because the cracking efficiency (% of Group V precursor cracked) is a function of temperature. Using Mixed Group V precursors results in a summation of the profiles in FIG. 7 and FIG. 8 and can result in a substantially uniform cross-wafer Group V concentration variation (e.g., cross-wafer Group V element concentration distribution 900 shown in FIG. 9).

In some aspects, mixed Group V precursors 522 can normalize (e.g., flatten) hydride and metal-organic Group V concentration distributions 700, 800 such that cross-wafer concentration profile plot 910 is substantially constant and/or linear across the wafer diameter. For example, as shown in FIG. 9, for mixed phosphine ($PH_3$) and tertiary-butyl phosphine (TBP) ($C_{12}H_{27}P$), cross-wafer Group V concentration profile 910 is constant (compared to the cross-wafer Group V concentration profile 710 shown in FIG. 7 and the cross-wafer Group V concentration profile 810 shown in FIG. 8), which improves uniformity and yield of epitaxial layer 210 in epitaxy process 500.

Figure 10:
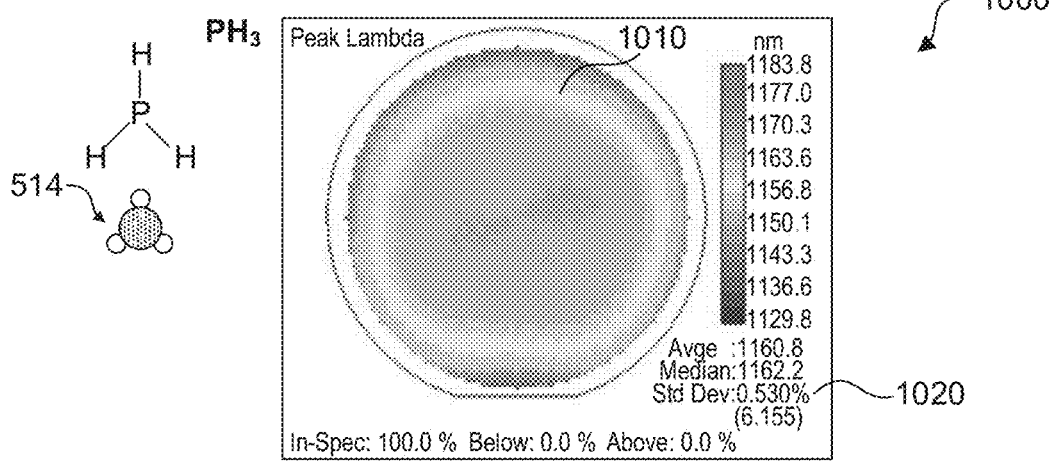
FIG. 10 is a map of photoluminescence wavelength for a wafer grown using a hydride Group V precursor, according to an exemplary aspect.
Figure 11:
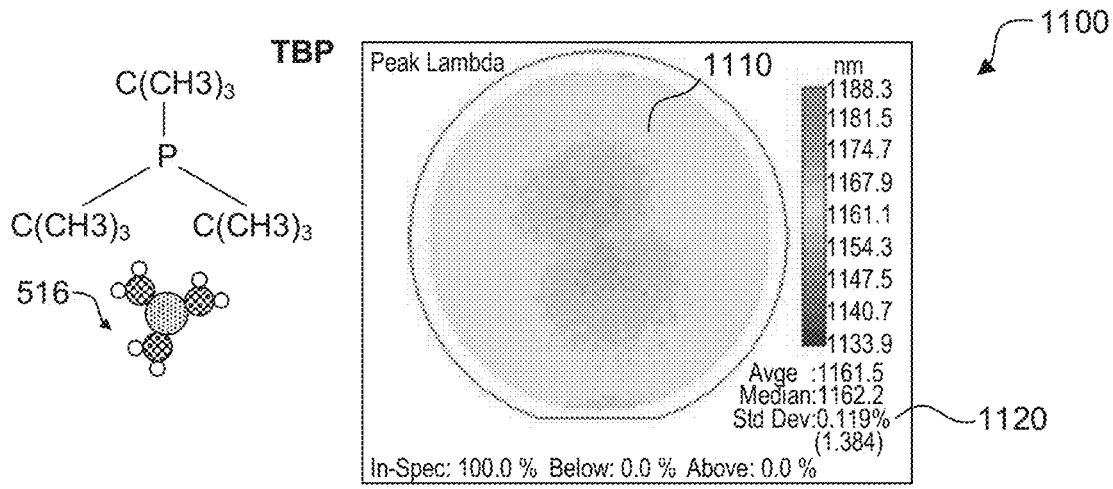
FIG. 11 is a map of photoluminescence wavelength for a wafer grown using a metal-organic Group V precursor, according to an exemplary aspect.
Figure 12:
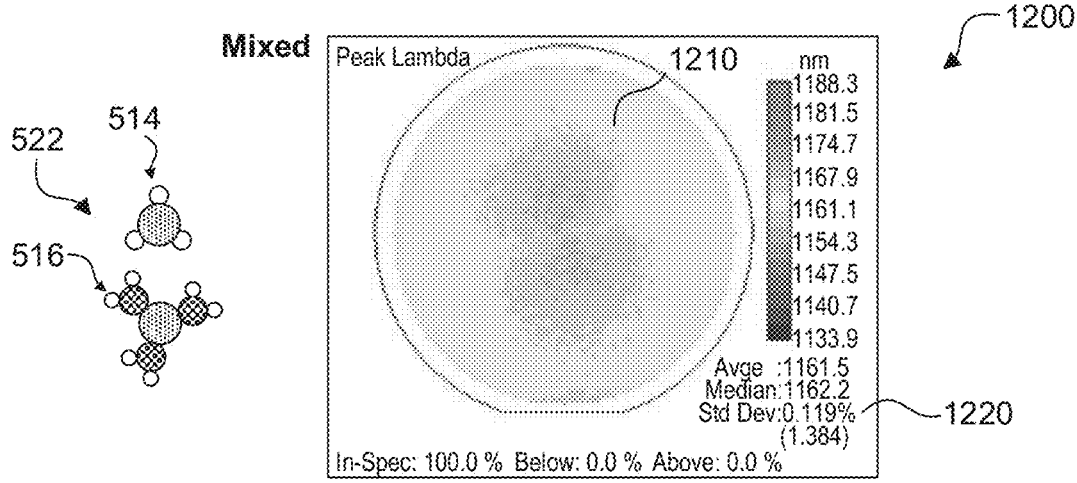
FIG. 12 is a map of photoluminescence wavelength for a wafer grown using mixed Group V precursors, according to an exemplary aspect.

FIGS. 10-12 illustrate wafer maps of photoluminescence (PL) wavelength that result from epitaxy process 500 using different Group V precursors/mixtures for alloys that contain both As and P. Since PL wavelength depends on the Group V concentrations, the PL wavelength maps 1000, 1100, 1200 are proxies for compositional uniformity. Although PL maps 1000, 1100, 1200 are shown in FIGS. 10-12, as stand-alone plots, the aspects of this disclosure can be used with other apparatuses, systems, and/or methods. In some aspects, a material grown by epitaxy process 500 can be a mixed Group V alloy, for example, the mixed Group V alloy can contain both As and P. In some aspects, epitaxy process 500 uses mixed Group V precursors for one of the constituent Group V elements (e.g., P) to achieve better uniformity of epitaxial layer 210 (e.g., As and P alloy). For example, $AsH_3$ precursor with mixed $PH_3$ and TBP precursors (e.g., 1200 shown in FIG. 12) achieves better uniformity than $AsH_3$ precursor with $PH_3$ precursor (e.g., 1000 shown in FIG. 10) and achieves equivalent or better uniformity than $AsH_3$ precursor with TBP precursor (e.g., 1100 shown in FIG. 11). The PL map for epitaxy process 500 using mixed Group V precursors for one of the constituent Group V elements (e.g., P as shown in e.g., 1200) is substantially more uniform than the PL map for the epitaxy process 500 that solely uses hydride Group V precursors (e.g., 1000) for a specific Group V element (e.g., P as shown in e.g., 1000). This demonstrates that the epitaxy process 500 that uses mixed Group V precursors for a specific Group V element results in improved compositional cross-wafer uniformity which results in improved device yield.

Although FIGS. 10-12 are examples for an alloy containing As and P, the concept applies to any alloy that contains more than one Group V element (e.g., GaAsSb and InGaAsNSb). In some aspects, this would apply to PL maps for materials made with any combination of Group V precursors (e.g., $AsH_3$, $PH_3$, $NH_3$, $SbH_3$, TBP, BPE, TMA, TBA, MEA, TBAm, DMHy, phenylhydrazine, TMSb, TESb, TIPSb, and/or Bi-MOF).

Exemplary Flow Diagrams

Figure 13:
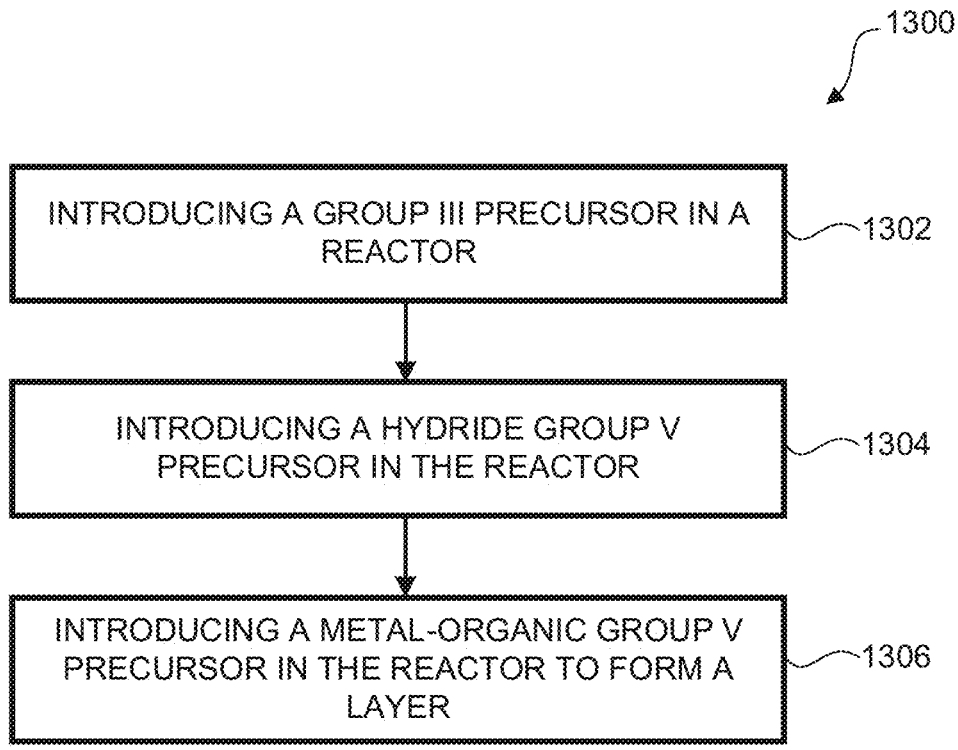
FIG. 13 is a flow diagram for forming the epitaxial layer shown in FIG. 5, according to an exemplary aspect.
Figure 14:
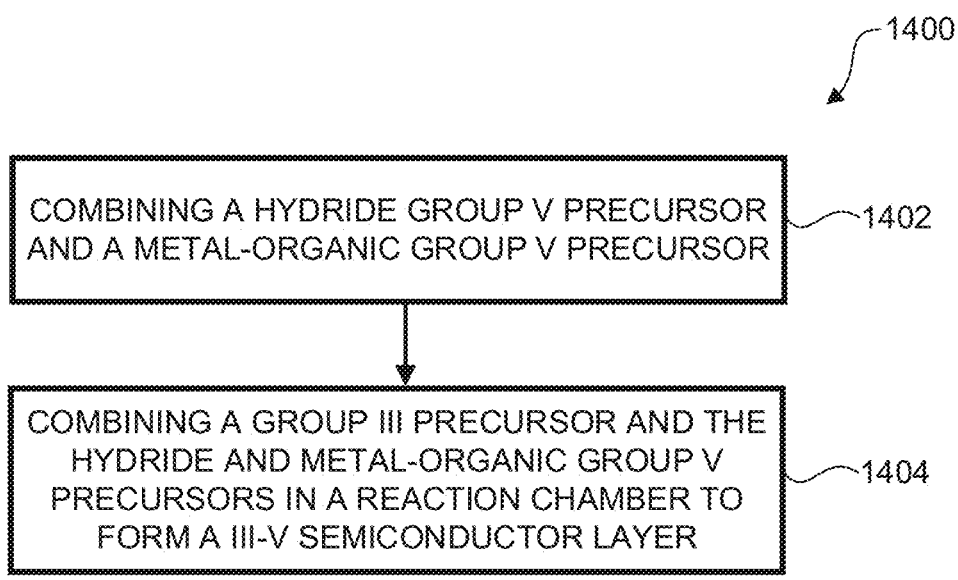
FIG. 14 is a flow diagram for forming the layered structure shown in FIG. 6, according to an exemplary aspect.

FIGS. 13 and 14 illustrate flow diagrams 1300, 1400 to describe the process of forming epitaxial layer 210 (e.g., layered structure 600), according to various exemplary aspects. It is to be appreciated that not all operations in FIGS. 13 and 14 are needed to perform the disclosure provided herein. Further, some of the operations can be performed simultaneously, sequentially, and/or in a different order than shown in FIGS. 13 and 14. Flow diagrams 1300, 1400 shall be described with reference to FIGS. 1, 4, 5, 6, 9, and 12. However, flow diagrams 1300, 1400 are not limited to those example aspects.

As shown in FIG. 13, flow diagram 1300 describes the process to form epitaxial layer 210 shown in FIGS. 1, 4, 5, and 6. In operation 1302, as shown in the example of FIGS. 1, 4, 5, and 6 Group III precursor 112, 512 is introduced (e.g., flows) in reactor 100, 100'. In operation 1304, as shown in the example of FIGS. 1, 4, 5, and 6 hydride Group V precursor 114, 514 is introduced (e.g., flows) in reactor 100, 100'. In operation 1306, as shown in the example of FIGS. 1, 4, 5, and 6 metal-organic Group V precursor 116, 516 is introduced (e.g., flows) in reactor 100, 100' to form epitaxial layer 210 in epitaxy process 500. In some aspects, as shown in the example of FIGS. 1, 4, 5, and 6, hydride Group V precursor 114, 514 and metal-organic Group V precursor 116, 516 can mixed in reactor 100, 100' (e.g., mixed Group V precursors 522).

In some aspects, epitaxial layer 210 can be formed on substrate 202 and form layered structure 600 (shown in FIG. 6).

As shown in FIG. 14, flow diagram 1400 describes the process to form epitaxial layer 210 shown in FIGS. 1, 4, 5, and 6. In operation 1402, as shown in the example of FIGS. 1, 4, 5, and 6 hydride Group V precursor 114, 514 and metal-organic Group V precursor 116, 516 are combined to form mixed Group V precursors 522. In operation 1404, as shown in the example of FIGS. 1, 4, 5, and 6, Group III precursor 112, 512 and mixed Group V precursors 522 are combined in reaction chamber 200, 200' to form epitaxial layer 210 in epitaxy process 500.

In some aspects, epitaxial layer 210 can form a III-V semiconductor layer. In some aspects, epitaxial layer 210 can be formed on substrate 202 and form layered structure 600 (shown in FIG. 6).

It is to be understood that the phraseology or terminology herein is for the purpose of description and not of limitation, such that the terminology or phraseology of the present specification is to be interpreted by those skilled in relevant art(s) in light of the teachings herein.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects can be practiced otherwise than as described. The description is not intended to limit the scope of the claims.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A method of forming a layer, the method comprising:
   introducing a Group III precursor in a reactor;
   introducing a hydride Group V precursor in the reactor; and
   introducing a metal-organic Group V precursor in the reactor to form the layer,
   wherein the hydride Group V precursor and the metal-organic Group V precursor comprise the same Group V element.

2. The method of claim 1, further comprising mixing the hydride Group V precursor and the metal-organic Group V precursor.

3. The method of claim 2, wherein the mixing occurs in a precursor manifold of the reactor.

4. The method of claim 2, wherein the mixing occurs in a nozzle or a showerhead of the reactor.

5. The method of claim 2, wherein the mixing occurs in a reaction chamber of the reactor.

6. The method of claim 2, wherein the mixing comprises normalising a concentration profile of the hydride Group V precursor and the metal-organic Group V precursor.

7. The method of claim 2, wherein:
   the mixing comprises controlling a mass concentration ratio between the hydride Group V precursor and the metal-organic Group V precursor, or
   the mixing comprises controlling reaction kinetics of the hydride Group V precursor and the metal-organic Group V precursor to control uniformity of the layer.

8. The method of claim 1, wherein the introducing the hydride Group V precursor comprises flowing phosphine ($PH_3$), arsine ($AsH_3$), ammonia ($NH_3$), stibine ($SbH_3$), or bismuthine ($BiH_3$).

9. The method of claim 1, wherein the introducing the metal-organic Group V precursor comprises flowing tertiary-butyl phosphine (TBP) ($C_{12}H_{27}P$), bisphosphinoethane (BPE) ($C_2H_8P_2$), trimethyl arsine (TMA) ($C_3H_9As$), tertiary-butyl arsine (TBA) ($C_4H_{11}As$), monoethyl arsine (MEA) ($C_2H_5As$), tertiary-butyl amine (TBAm) ($C_4H_{11}N$), dimethylhydrazine (DMHy) ($C_2H_8N_2$), phenylhydrazine ($C_6H_8N_2$), trimethyl antimony (TMSb) ($C_3H_9Sb$), triethyl antimony (TESb) ($C_6H_{15}Sb$), tri-isopropyl antimony (TIPSb) ($C_9H_{21}Sb$), or a bismuth metal-organic framework (Bi-MOF).

10. The method of claim 1, wherein:
   the hydride Group V precursor comprises phosphine ($PH_3$), and
   the metal-organic Group V precursor comprises tertiary-butyl phosphine (TBP) ($C_{12}H_{27}P$).

11. The method of claim 1, wherein:
   the hydride Group V precursor comprises arsine ($AsH_3$) and the metal-organic Group V precursor comprises trimethyl arsine (TMA) ($C_3H_9As$),
   the hydride Group V precursor comprises ammonia ($NH_3$) and the metal-organic Group V precursor comprises dimethylhydrazine (DMHy) ($C_2H_8N_2$), or
   the hydride Group V precursor comprises stibine ($SbH_3$) and the metal-organic Group V precursor comprises trimethyl antimony (TMSb) ($C_3H_9Sb$).

12. A method of forming a layered structure, the method comprising:
   combining a hydride Group V precursor and a metal-organic Group V precursor; and
   combining a Group III precursor and the hydride and metal-organic Group V precursors in a reaction chamber to form a III-V semiconductor layer on a substrate,
   wherein the hydride Group V precursor and the metal-organic Group V precursor comprise the same Group V element.

13. The method of claim 12, wherein the combining the Group III precursor and the hydride and metal-organic Group V precursors comprises reacting the Group III precursor and the hydride and metal-organic Group V precursors in a metal-organic chemical vapor deposition (MOCVD) reaction chamber.

14. The method of claim 12, wherein the combining the hydride and metal-organic Group V precursors comprises combining the hydride and metal-organic Group V precursors in a precursor manifold, a nozzle, or a showerhead prior to combining the Group III precursor and the hydride and metal-organic Group V precursors in the reaction chamber.

15. The method of claim 12, wherein the combining the hydride and metal-organic Group V precursors comprises separately introducing the hydride and metal-organic Group V precursors into the reaction chamber.

16. The method of claim 12, wherein the combining comprises sequentially introducing the hydride Group V precursor, the metal-organic Group V precursor, and the Group III precursor into the reaction chamber, and wherein:
   the sequentially introducing comprises introducing the Group III precursor with one of the Group V precursors separate from the other Group V precursor, or
   the sequentially introducing comprises introducing the hydride and metal-organic Group V precursors separate from the Group III precursor.

17. A layered structure comprising:
   a layer comprising a III-V material grown with a hydride Group V precursor and a metal-organic Group V precursor,
   wherein the hydride Group V precursor and the metal-organic Group V precursor comprise the same Group V element.

18. The layered structure of claim 17, wherein the layer comprises a uniformity that is higher than a uniformity of the layer comprising the III-V material grown only with the hydride Group V precursor or only with the metal-organic Group V precursor.

19. The layered structure of claim 17, wherein the layer comprises a uniformity having a cross-wafer wavelength standard deviation of less than or equal to 0.1%.

20. The layered structure of claim 17, wherein the layer comprises indium gallium arsenide (InGaAs), indium gallium phosphide (InGaP), gallium indium arsenide phosphide (GaInAsP), indium arsenide phosphide (InAsP), aluminum indium gallium arsenide phosphide (AlInGaAsP), or gallium arsenide phosphide (GaAsP).

21. A heterojunction bipolar transistor (HBT) comprising the layered structure as claimed in claim 17; a field effect transistor (FET) comprising the layered structure as claimed in claim 17; or a photonic device that emits or detects light comprising the layered structure as claimed in claim 17.

* * * * *